US008431976B2

(12) United States Patent
Hirata

(10) Patent No.: US 8,431,976 B2
(45) Date of Patent: Apr. 30, 2013

(54) SOLID-STATE IMAGING DEVICE WITH CHANNEL STOP REGION WITH MULTIPLE IMPURITY REGIONS IN DEPTH DIRECTION

(75) Inventor: Kiyoshi Hirata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/348,733

(22) Filed: Jan. 12, 2012

(65) Prior Publication Data

US 2012/0104533 A1    May 3, 2012

Related U.S. Application Data

(60) Continuation of application No. 12/537,829, filed on Aug. 7, 2009, now Pat. No. 8,115,268, which is a continuation of application No. 11/677,301, filed on Feb. 21, 2007, now Pat. No. 7,642,614, which is a division of application No. 10/705,552, filed on Nov. 11, 2003, now Pat. No. 7,198,976.

(30) Foreign Application Priority Data

Nov. 14, 2002 (JP) ................. 2002-330150

(51) Int. Cl.
  *H01L 31/062* (2006.01)
(52) U.S. Cl.
  USPC ............................ 257/292; 257/184; 257/291
(58) Field of Classification Search .................. 257/233, 257/291, 292, 444, 461, 446, E31.058, E31.063, 257/E31.115, E25.032, E27.133
See application file for complete search history.

(56) References Cited

U.S. PATENT DOCUMENTS

| 5,238,864 | A |   | 8/1993  | Maegawa et al. |
| 5,252,851 | A | * | 10/1993 | Mita et al. ..................... 257/446 |
| 5,602,415 | A | * | 2/1997  | Kubo et al. .................... 257/443 |
| 5,604,150 | A |   | 2/1997  | Mehrad |
| 5,637,893 | A |   | 6/1997  | Furumiya |
| 5,858,812 | A | * | 1/1999  | Furumiya ....................... 438/76 |
| 5,969,337 | A |   | 10/1999 | Yiannoulos |

(Continued)

FOREIGN PATENT DOCUMENTS

| JP | 08-227988 | 9/1996 |
| JP | 08-227989 | 9/1996 |

(Continued)

OTHER PUBLICATIONS

Japanese Patent Office Action dated Jun. 16, 2002 for Japanese Application No. 2002-330150.

(Continued)

*Primary Examiner* — Marc Armand
*Assistant Examiner* — Bilkis Jahan
(74) *Attorney, Agent, or Firm* — Sheridan Ross P.C.

(57) ABSTRACT

Channel stop sections formed by multiple times of impurity ion implanting processes. Four-layer impurity regions are formed across the depth of a semiconductor substrate (across the depth of the bulk) so that a P-type impurity region is formed deep in the semiconductor substrate; thus, incorrect movement of electric charges is prevented. Other four-layer impurity regions of another channel stop section are decreased in width step by step across the depth of the substrate, so that the reduction of a charge storage region of a light receiving section due to the dispersion of P-type impurity in the channel stop section is prevented in the depth of the substrate.

16 Claims, 8 Drawing Sheets

U.S. PATENT DOCUMENTS

| | | |
|---|---|---|
| 6,211,509 B1 * | 4/2001 | Inoue et al. ............... 250/208.1 |
| 6,268,234 B1 | 7/2001 | Yoshida |
| 6,380,603 B1 | 4/2002 | Takimoto et al. |
| 6,403,994 B1 | 6/2002 | Wada |
| 6,403,998 B1 * | 6/2002 | Inoue ............................ 257/292 |
| 6,455,345 B1 | 9/2002 | Tanabe |
| 6,455,385 B1 | 9/2002 | Alvis et al. |
| 6,521,920 B2 | 2/2003 | Abe |
| 6,599,772 B2 | 7/2003 | Abe |
| 6,765,246 B2 | 7/2004 | Inagaki |
| 6,784,015 B2 | 8/2004 | Hatano et al. |
| 6,927,091 B2 | 8/2005 | Harada |
| 2002/0048837 A1 | 4/2002 | Burke et al. |
| 2003/0085399 A1 | 5/2003 | Inagaki |

FOREIGN PATENT DOCUMENTS

| | | |
|---|---|---|
| JP | 09-186310 | 7/1997 |
| JP | 09-213925 | 8/1997 |
| JP | 10-321550 | 12/1998 |
| JP | 2000-150852 | 5/2000 |

OTHER PUBLICATIONS

Japanese Office Action dated Dec. 6, 2011 for Japanese Application No. 2010-21208.

* cited by examiner

PRIOR ART

PRIOR ART

SOLID-STATE IMAGING DEVICE WITH CHANNEL STOP REGION WITH MULTIPLE IMPURITY REGIONS IN DEPTH DIRECTION

CROSS-REFERENCE TO RELATED APPLICATIONS

The present application is a continuation and claims priority to U.S. patent application Ser. No. 12/537,829 filed Aug. 7, 2009, which is a continuation of U.S. patent application Ser. No. 11/677,301 filed on Feb. 21, 2007, now U.S. Pat. No. 7,642,614, which is a division of U.S. patent application Ser. No. 10/705,552, filed on Nov. 11, 2003, now U.S. Pat. No. 7,198,976, the entireties of which are incorporated herein by reference to the extent permitted by law.

FIELD OF THE INVENTION

The present invention relates to a solid-state imaging device formed by integrating a plurality of photosensors on a substrate in which a channel stop section for preventing leakage of electric charges between the photosensors can be effectively formed and to a method for manufacturing the same.

FIG. 6 is an explanatory view of an example of the arrangement of a CCD solid-state imaging device.

The solid-state imaging device includes a photosensor (imaging region) 410, a CCD vertical transfer section 420, a CCD horizontal transfer section 430, an output 440 and so on in a substrate 400.

The photosensor 410 has a plurality of the CCD vertical transfer sections 420 along the respective photosensor trains, in which signal charges stored by the photosensors 412 are output to the CCD vertical transfer sections 420 and sequentially transferred in the vertical direction by the driving of the CCD vertical transfer sections 420.

The CCD vertical transfer sections 420 have the CCD horizontal transfer section 430 at the end, in which the signal charges transferred from the CCD vertical transfer sections 420 are output to the CCD horizontal transfer sections 430 line by line and sequentially transferred in the horizontal direction by the driving of the CCD horizontal transfer sections 430.

The output 440 receives the signal charges transferred by the CCD horizontal transfer sections 430 by a floating diffusion (FD), senses the potential of the FD by an amp transistor, and converts it to an electric signal for output.

The solid-state imaging device has a channel stop section for preventing charge leakage between the pixels along the vertical transfer direction (along the column of the photosensors) and the photosensor and between the photosensors along the horizontal transfer direction (along the row of the photosensors) and the CCD vertical transfer section (for example, refer to Japanese Unexamined Patent Application Publication No. 4-280675).

FIG. 7 is a sectional view of an embodiment of the channel stop section provided between the photosensors along the vertical transfer direction, showing a section taken along line A-A of FIG. 6.

As shown in the drawing, a photodiode region constituting a photo receiving section 510 of each photosensor has a P+ type impurity region 510A formed in the outer layer of a substrate 400 and an N-type impurity region 510B formed under the P+ type impurity region 510A.

Channel stop sections 520, or P-type impurity regions, are provided in the vicinity of opposite sides of the photodiode region along the vertical transfer direction.

Although transfer electrodes 550 of the CCD vertical transfer sections 420 and so on are provided on the top of the substrate 400 through a gate insulating film (not shown), their detailed description will be omitted here because they are not directly related to the present invention.

FIG. 8 is a sectional view of an embodiment of the channel stop section provided between a photosensor along the horizontal transfer direction and the vertical transfer section, showing a section taken along line B-B of FIG. 6.

As shown in the drawing, the photodiode region of each photosensor includes the P+ type impurity region 510A and the N-type impurity region 510B, as that shown in FIG. 7.

The CCD vertical transfer section 420 is formed on the side of the photodiode region through a readout gate.

The CCD vertical transfer section 420 is formed of an upper N-type impurity region 420A and a lower P-type impurity region 420B.

A channel stop section 520 that is a P-type impurity region is provided between the CCD vertical transfer section 420 and the photodiode region of the adjacent photosensor train.

The above-described solid-state imaging device has a conspicuous tendency to reduce the space between the vertical and horizontal photosensors with the reduction of the photosensor size owing to increasing number of photosensors and advancement toward miniaturization.

Therefore, the structure of the related-art channel stop section that is formed only in the outer layer of the substrate has the problem of not effectively preventing a phenomenon in which electric charges that are photoelectrically converted in the photodiode region are mixed to the adjacent photosensors (hereinafter, referred to as a color mixing phenomenon).

In order to prevent the color mixing phenomenon, it is necessary to increase energy during implantation of impurity ions to the channel stop section to thereby form the channel stop section deep in the substrate (along the depth of the bulk). However, when ions are implanted with high energy, the P-type impurity near the surface declines in concentration and so a smear component in the surface of the substrate cannot be reduced, leading an adverse smear phenomenon.

The ion plantation with high energy has the problem of easily causing dispersion of the P-type impurity, narrowing a charge storage region of the light receiving section (photodiode region), which decreases sensitivity and saturation signals.

BACKGROUND OF THE INVENTION

Accordingly, it is an object of the present invention to provide a method for manufacturing a solid-state imaging device that provides a high quality image by forming a channel stop section that is effective in miniaturization of photosensors to prevent a color mixing phenomenon and so on.

By a method for manufacturing a solid-state imaging device, according to the present invention, a channel stop section is formed by multiple times of ion implantation with multiple implanting energies. Thus, a multilayer impurity region can be formed across the depth of a substrate to form a channel stop section.

Therefore, the leakage of signal charges between adjacent photosensors and between a photosensor and a transfer section can be effectively prevented; thus, a color mixing phenomenon can be effectively prevented.

Since multiple times of ion implantation are made for multiple implantation areas during multiple times of impurity ion implanting processes, the dispersion of impurity particularly deep in the substrate can be prevented, effects to a photoelectric conversion section can be reduced, and decreases in sensitivity and saturation signals can be effectively prevented.

Since the multiple times of ion implantation are made at multiple ion concentrations during multiple times of impurity ion implanting processes, the impurity regions of the respective layers of the channel stop section can be given optimum impurity concentration; thus, anti-smear measures on the surface of the substrate can be effectively taken.

Since a solid-state imaging device according to the invention includes a channel stop section having multiple layers across the depth of the substrate, the leakage of signal charges between adjacent photosensors and between a photosensor and a transfer section can be effectively prevented; thus, a color mixing phenomenon can be effectively prevented.

Since the areas of the multiple layers of the channel stop section are multiple, the dispersion of impurity particularly deep in the substrate can be prevented, effects to a photoelectric conversion section can be reduced, and decreases in sensitivity and saturation signals can be effectively prevented.

Furthermore, since the ion concentrations of the multiple layers of the channel stop section are optimum, anti-smear measures on the surface of the substrate can be effectively taken.

SUMMARY OF THE INVENTION

Accordingly, it is an object of the present invention to provide a method for manufacturing a solid-state imaging device that provides a high quality image by forming a channel stop section that is effective in miniaturization of photosensors to prevent a color mixing phenomenon and so on.

By a method for manufacturing a solid-state imaging device, according to the present invention, a channel stop section is formed by multiple times of ion implantation with multiple implanting energies. Thus, a multilayer impurity region can be formed across the depth of a substrate to form a channel stop section.

Therefore, the leakage of signal charges between adjacent photosensors and between a photosensor and a transfer section can be effectively prevented; thus, a color mixing phenomenon can be effectively prevented.

Since multiple times of ion implantation are made for multiple implantation areas during multiple times of impurity ion implanting processes, the dispersion of impurity particularly deep in the substrate can be prevented, effects to a photoelectric conversion section can be reduced, and decreases in sensitivity and saturation signals can be effectively prevented.

Since the multiple times of ion implantation are made at multiple ion concentrations during multiple times of impurity ion implanting processes, the impurity regions of the respective layers of the channel stop section can be given optimum impurity concentration; thus, anti-smear measures on the surface of the substrate can be effectively taken.

Since a solid-state imaging device according to the invention includes a channel stop section having multiple layers across the depth of the substrate, the leakage of signal charges between adjacent photosensors and between a photosensor and a transfer section can be effectively prevented; thus, a color mixing phenomenon can be effectively prevented.

Since the areas of the multiple layers of the channel stop section are multiple, the dispersion of impurity particularly deep in the substrate can be prevented, effects to a photoelectric conversion section can be reduced, and decreases in sensitivity and saturation signals can be effectively prevented.

Furthermore, since the ion concentrations of the multiple layers of the channel stop section are optimum, anti-smear measures on the surface of the substrate can be effectively taken.

DESCRIPTION OF THE PRESENTLY PREFERRED EMBODIMENTS

Embodiments of a solid-state imaging device and a method for manufacturing the same according to the present invention will be specifically described hereinafter.

Figure 1:
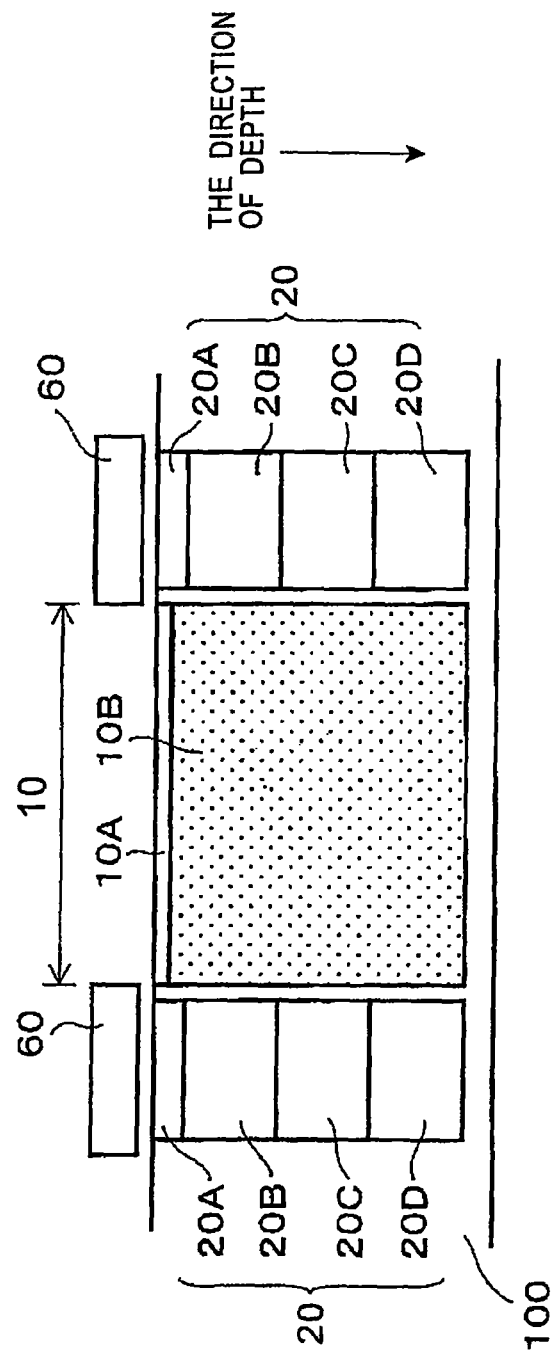
FIG. 1 is a sectional view of a solid-state imaging device along the vertical direction according to an embodiment of the present invention.
Figure 2:
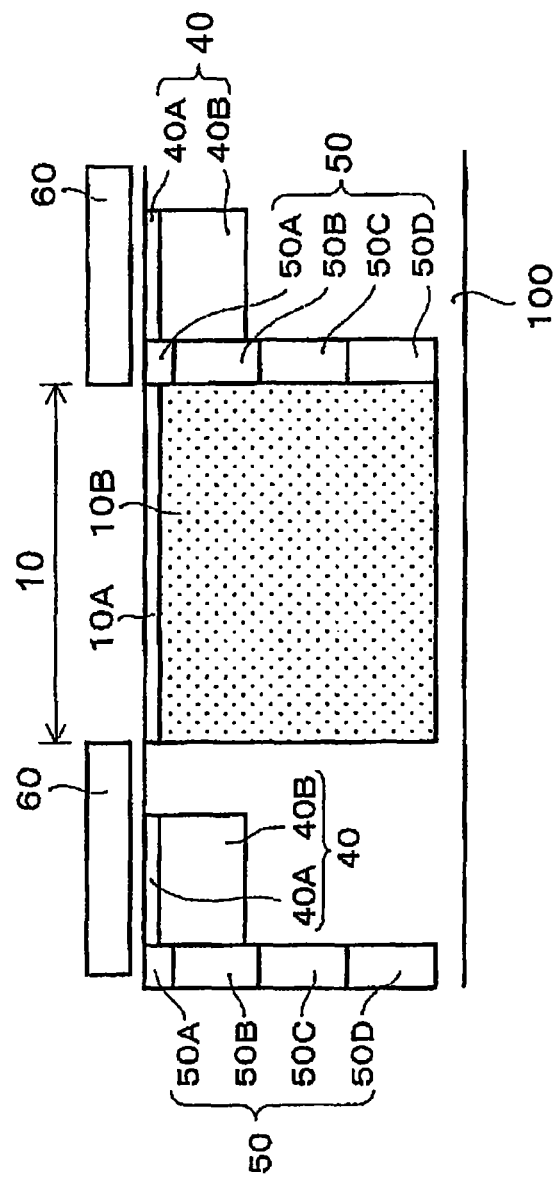
FIG. 2 is a sectional view of the solid-state imaging device along the horizontal direction according to the embodiment of the present invention.

FIGS. 1 and 2 are sectional views of a solid-state imaging device manufactured by the method according to an embodiment, FIG. 1 showing an embodiment of a channel stop section provided between photosensors along the vertical transfer direction, and FIG. 2 showing an embodiment of a channel stop section provided between the photosensors along the horizontal transfer direction. The entire structure of the solid-state imaging device is the same as that of the related art shown in FIG. 6, wherein FIG. 1 corresponds to the section taken along line A-A of FIG. 6 and FIG. 2 corresponds to the section taken along line B-B of FIG. 6.

Referring first to FIG. 1, a photodiode region constituting a light receiving section 10 of each photosensor includes a P+ type impurity region (hole storage region) 10A formed in the outer layer of a substrate 100 and an N-type impurity region (electron storage region) 10B formed under the P+-type impurity region 10A. The photodiode region photoelectrically converts light that is incident from above, absorbs holes into the P+ type impurity region 10A, and stores electrons in the N-type impurity region 10B, a lower depletion layer and so on.

The photoelectric conversion in the light receiving section 10 is mainly performed in a depletion region between the N-type impurity region 10B and the P+ type impurity region 10A and in a depletion region between the N-type impurity region 10B and a lower P-type impurity region (not shown).

A channel stop section 20 formed of a multilayer P-type impurity region is provided in the vicinity of opposite sides of the photodiode region along the vertical transfer direction.

The channel stop section 20 is formed by multiple times of impurity implanting processes by which four impurity regions 20A, 20B, 20C, and 20D are formed across the depth of the substrate 100 (along the depth of the bulk) to form a P-type region deep in the substrate 100, thereby preventing leakage of electric charges.

Referring to FIG. 2, the photodiode region of each photosensor includes the P+ type impurity region 10A and the N-type impurity region 10B, as that shown in FIG. 1.

A CCD vertical transfer section 40 is formed on the side of the photodiode region through a readout gate.

The CCD vertical transfer section 40 is formed of an upper N-type impurity region 40A and a lower P-type impurity region 40B.

A channel stop section 50 that is a multilayer P-type impurity region is provided between the CCD vertical transfer section 40 and the photodiode region of the adjacent photosensor train.

The channel stop section 50 is formed by multiple times of impurity implanting processes by which four impurity regions 50A, 50B, 50C, and 50D are formed across the depth of the substrate 100 (along the depth of the bulk) to form a P-type region deep in the substrate 100, thereby preventing leakage of electric charges.

In FIGS. 1 and 2, transfer electrodes 60 of the CCD vertical transfer sections 40 and so on are provided on the top of the substrate 100 through a gate insulating film (not shown). However, their detailed description will be omitted here because they are not directly related to the present invention.

When the channel stop sections 20 and 50 are formed in the above-described solid-state imaging device, an ion implantation region is set using a specified mask and multiple times of ion implanting processes are performed with multiple ion implanting energies and impurity concentrations, so that the multilayer impurity regions 20A, 20B, 20C, and 20D and the impurity regions 50A, 50B, 50C, and 50D are formed.

Thus, the channel stop sections 20 and 50 can be formed deep into the substrate 100, thereby preventing the leakage of signal charges between the devices to reduce color mixture.

Since the concentration of impurity in each ion implanting process can be set as appropriate, the concentration of impurity near the surface of the substrate 100 that is formed with low implanting energy can be sufficiently ensured by making the ion concentration of impurity in an ion implanting process with relatively high implanting energy higher than that in an ion implanting process with relatively low implanting energy, so that a smear phenomenon can be prevented.

When the solid-state imaging device is formed, ions are continuously implanted into the substrate 100 to form the photodiode region (light receiving section 10), the CCD vertical transfer section 40, and the respective impurity regions of the channel stop sections 20 and 50; the order thereof is not particularly limited.

Also the order of the multiple times of ion implanting processes for forming the channel stop sections 20 and 50 is not particularly limited.

The mask for ion implantation includes various types in addition to a general resist mask; therefore, it is not particularly limited.

A specific energy and the concentration of impurity in each ion implanting process can be set as appropriate and are not particularly limited.

In the embodiment, the vertical channel stop section 20 and the horizontal channel stop section 50 are separately formed so as to be optimized for the respective required characteristics, with individual ion implanting energy and impurity concentration. In FIGS. 1 and 2, although both the channel stop sections 20 and 50 have four-layer structure (or four-step ion implantation), they are not limited to that and may have a structure other than the four-layer (four-step) structure. The vertical channel stop section 20 and the horizontal channel stop section 50 may not necessarily have the same number of layers.

The impurity concentration may not be varied at all the layers but may be varied at part of the layers.

In the above embodiment, the ion implanting processes for forming the channel stop sections 20 and 50 are carried out with multiple energies and concentrations. However, the ion implantation region is varied in each ion implanting process by changing a mask in each ion implanting process, so that the width across the channel of the respective impurity regions of the channel stop sections 20 and 50 may be varied.

Figure 3:
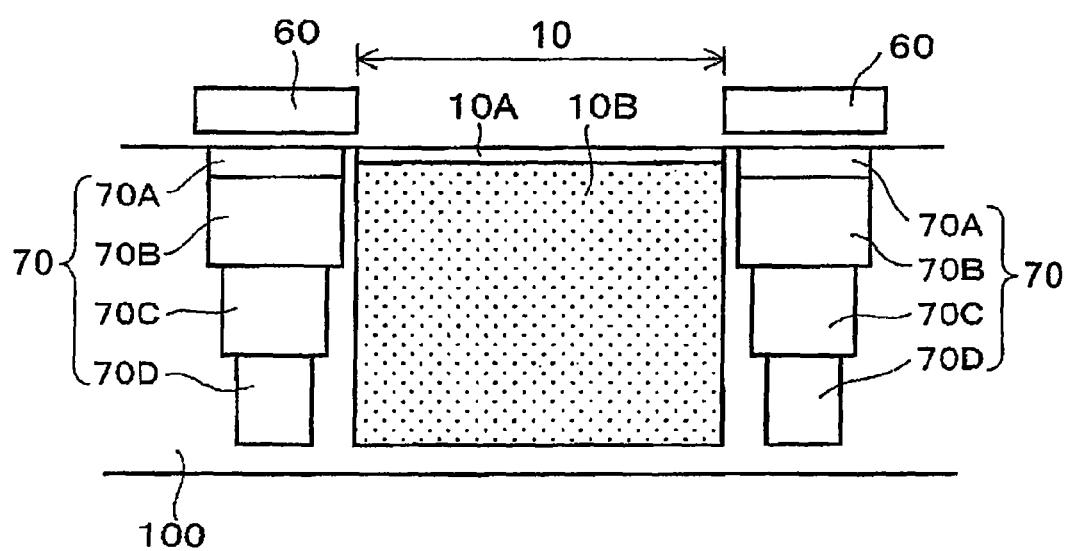
FIG. 3 is a sectional view of a solid-state imaging device along the vertical direction according to another embodiment of the present invention.

FIG. 3 is a sectional view of an example of the channel stop section along the vertical transfer direction. Since components other than a channel stop section 70 are the same as those of FIG. 1, they are given the same numerals and there description will be omitted.

As shown in the drawing, the channel stop section 70 includes four-layer impurity regions 70A, 70B, 70C, and 70D. When the ion implanting area in an ion implanting process with relatively high implanting energy is made smaller than that in an ion implanting process with relatively low implanting energy, the reduction of the charge storage region of the light receiving section 10 in the deep part of the substrate 100 by the dispersion of P-type impurity of the channel stop section 70 can be prevented; thus, sensitivity of the light receiving section 10 and saturation signals can be increased.

The energy and the impurity concentration can be set as those in FIG. 1.

Although the widths of all the layers of the channel stop section 70 may be varied, only the width of part of the layers may be varied so that only the impurity regions 70A and 70B have the equal width, as shown in FIG. 3. In this case, the layers of an equal width can be formed with a common mask.

The multi-step ion implantation may also be made for the channel stop section along the horizontal transfer direction, with multiple widths.

The above-described embodiments offer the following advantages:

(1) Referring to FIGS. 1 to 3, when multi-step ion implantation of the channel stop section between the vertical photosensors and the channel stop section between the horizontal light receiving section and the vertical transfer section is carried out with multiple energies, a color mixing phenomenon can be prevented in which photoelectrically converted charges are mixed to the adjacent photosensors.

(2) Referring to FIG. 3, when the region of ion implantation with high energy reduced, a color mixing phenomenon can be prevented without narrowing the charge storage region of the light receiving section and decreasing sensitivity and saturation signal.

(3) Referring to FIGS. 1 to 3, when ions are implanted into the channel stop section with high energy, the variation of an overflow barrier at charge storage can be reduced; thus the occurrence of a knee-point (Qknee) in output characteristics can be prevented.

(4) When ion implantation of the channel stop section between the horizontal light receiving section and the vertical transfer section is carried out with multiple energies, a smear phenomenon near the surface and in the bulk can be prevented.

Figure 4:
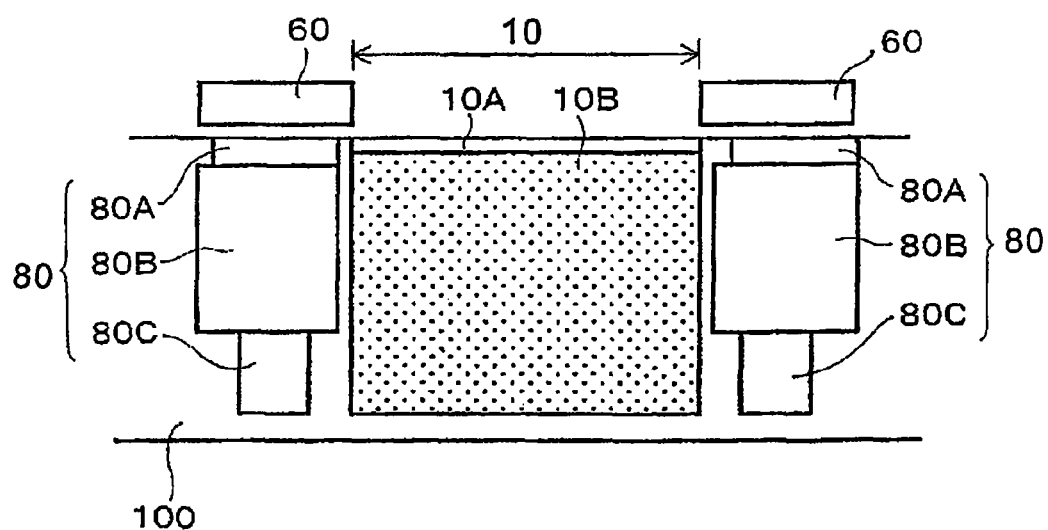
FIG. 4 is a sectional view of a solid-state imaging device along the vertical direction according to yet another embodiment of the present invention.

In the above-described embodiments, the positional relationship of the multi-step ion implanted impurity regions is only an example, and the thickness of the impurity regions across the depth of the substrate, the shape, and the number of layers are not limited to that. For example, as shown in FIG. 4, of the multilayer impurity region of a channel stop section 80 (three-layer impurity regions 80A, 80B, and 80C in the drawing), the middle-layer impurity region (the impurity region 80B in the drawing) may be larger in thickness and also in lateral width than the other impurity regions or vice versa.

As a matter of course, the multilayer ion-implanted impurity region may have a part overlapping with the upper and lower impurity regions in the strict sense.

In the above embodiments, although the multilayer ion-implanted impurity region is formed such that the bottom of the lowermost-layer region has a depth substantially equal to that of the bottom of the N-type impurity region 10B in the light receiving section 10, it is not limited to that.

Figure 5:
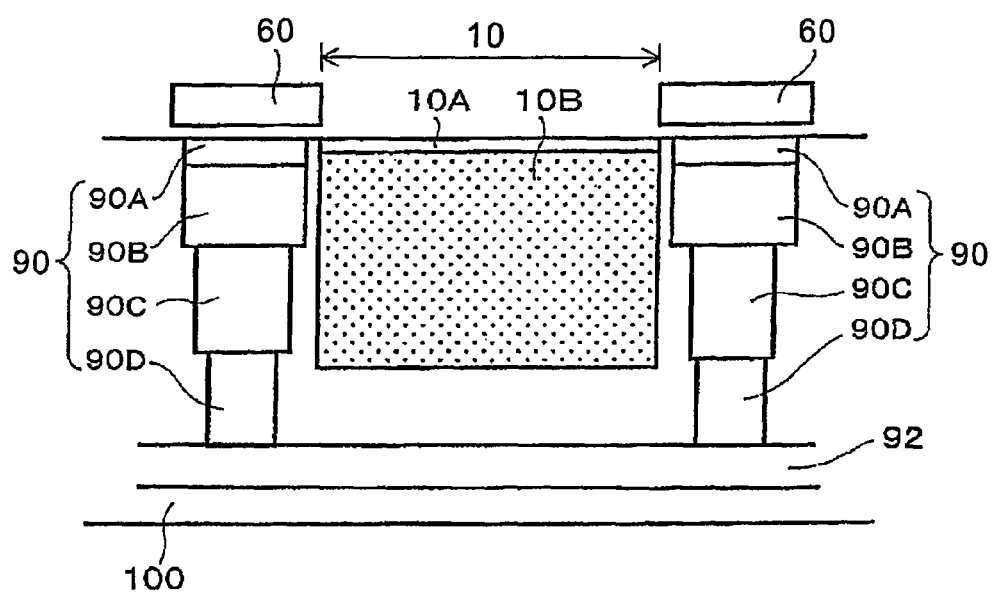
FIG. 5 is a sectional view of a solid-state imaging device along the vertical direction according to still another embodiment of the present invention.

For example, in order to prevent color mixture in a further lower region across the depth of the substrate 100, as shown in FIG. 5, the bottom of the lowermost-layer region (an impurity region 90D in the drawing) of the multilayer ion-implanted impurity region (four-layer impurity regions 90A, 90B, 90C, and 90D in the drawing) of a channel stop section 90 may be formed deeper than the bottom of the N-type impurity region 10B.

As shown in FIG. 5, an overflow barrier 92 located below the light receiving section 10 and the multilayer ion-implanted impurity region (the impurity region 90D in the drawing) may be in contact with each other.

In this case, the holes stored in the overflow barrier 92 can be discharged to the surface of the substrate 100 through the multilayer ion-implanted impurity region. The multilayer ion-implanted impurity region is preferably formed such that the closer to the surface of the substrate 100 the region is, the higher the concentration of the P-type impurity is.

Although a preferred form of the invention has been described in which it is applied to a CCD solid-state imaging device, it is to be understood that the invention is applied not only to the CCD solid-state imaging device but also to a CMOS solid-state imaging device.

As described above, by the method for manufacturing the solid-state imaging device according to the invention, the channel stop section is formed by multiple times of impurity ion implanting processes with multiple implanting energies. Thus, a multilayer impurity region can be formed across the depth of the substrate as a channel stop section.

Therefore, leakage of signal charges between the adjacent photosensors and between the photosensor and the transfer section can be effectively prevented, so that a color mixing phenomenon and so on can be effectively prevented.

During the multiple times of impurity ion-implantation processes, the ion implantation is carried out for multiple implantation areas, so that the dispersion of the impurity can be reduced particularly deep in the substrate, the effects to the photoelectric conversion section can be reduced, and decreases in sensitivity and saturation signals can be effectively prevented.

Furthermore, during the multiple times of impurity ion-implantation processes, the ion implantation is carried out at multiple impurity concentrations, so that the respective impurity regions of the channel stop section can be formed at optimum impurity concentrations; thus anti-smear measures on the surface of the substrate can be effectively taken.

Since the solid-state imaging device according to the invention includes a channel stop section having a multilayer impurity region across the depth of the substrate, leakage of signal charges between the adjacent photosensors and between the photosensor and the transfer section can be effectively prevented; thus, a color mixing phenomenon and so on can be effectively prevented.

Since the multilayer impurity region of the channel stop section has multiple areas, the dispersion of impurity particularly deep in the substrate can be prevented, the effects to the photoelectric conversion section can be reduced, and decreases in sensitivity and saturation signals can be effectively prevented.

Furthermore, the multilayer impurity region of the channel stop section has an optimum impurity concentration at each layer; thus anti-smear measures on the surface of the substrate can be effectively taken.

BRIEF DESCRIPTION OF THE DRAWINGS

Figure 6:
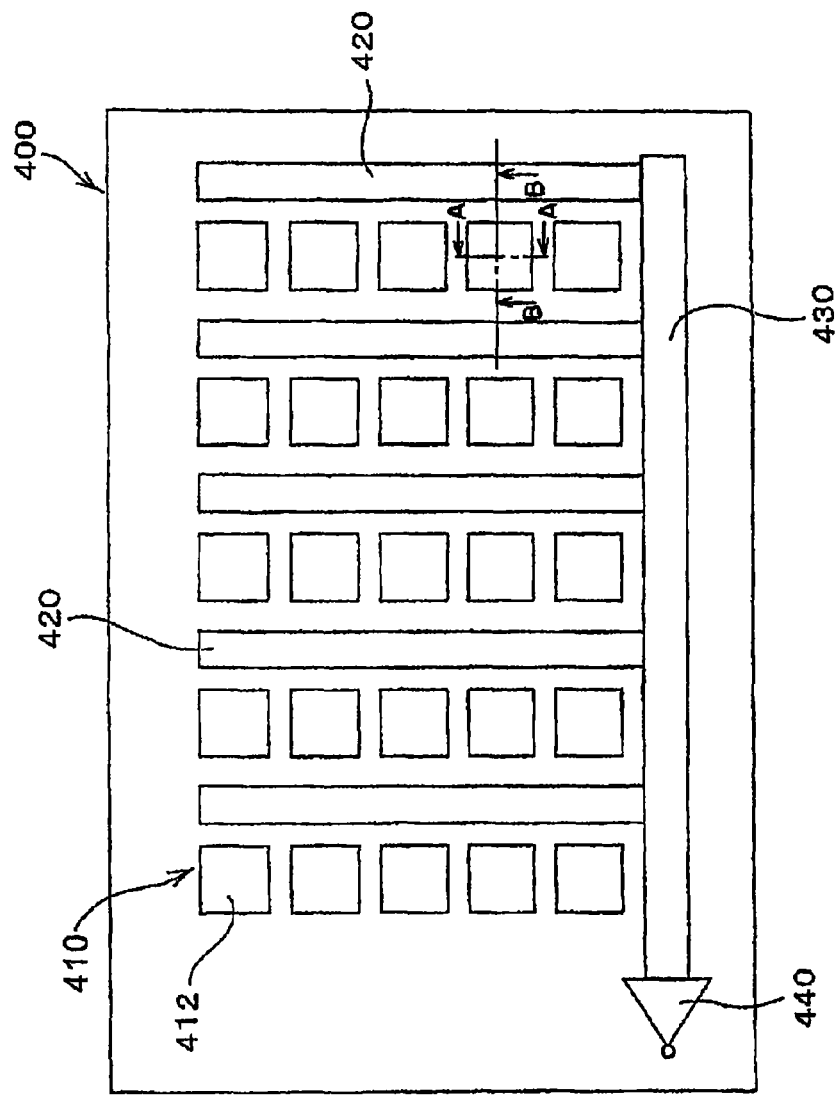
FIG. 6 is a plan view of the arrangement of a CCD solid-state imaging device.
Figure 7:
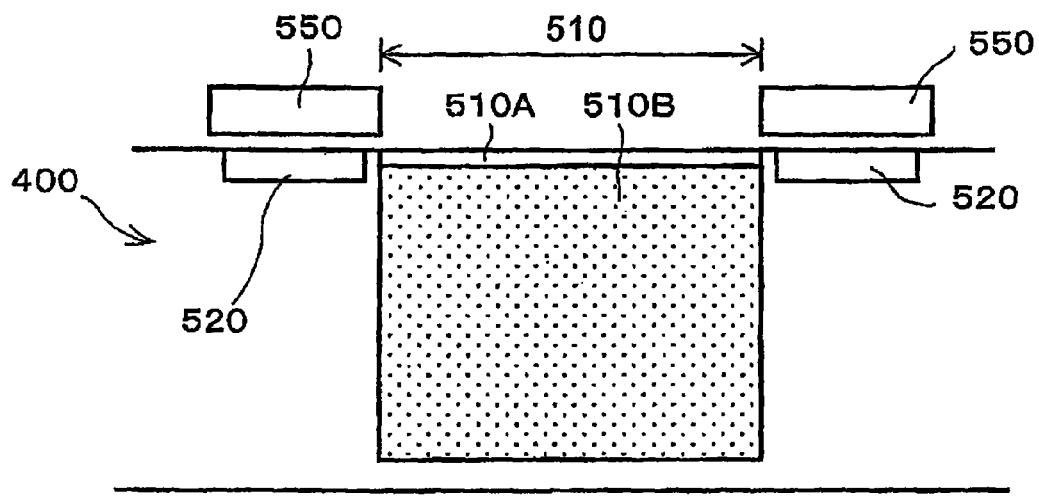
FIG. 7 is a sectional view of a related-art solid-state imaging device along the vertical direction.
Figure 8:
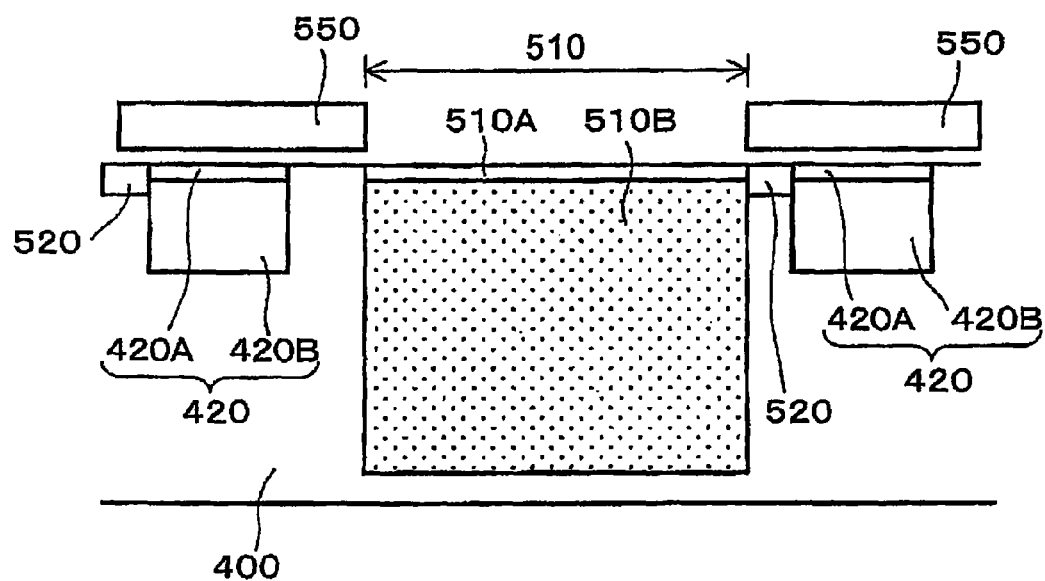
FIG. 8 is a sectional view of the related-art solid-state imaging device along the horizontal direction.

FIG. 1 is a sectional view of a solid-state imaging device along the vertical direction according to an embodiment of the present invention;

FIG. 2 is a sectional view of the solid-state imaging device along the horizontal direction according to the embodiment of the present invention;

FIG. 3 is a sectional view of a solid-state imaging device along the vertical direction according to another embodiment of the present invention;

FIG. 4 is a sectional view of a solid-state imaging device along the vertical direction according to yet another embodiment of the present invention;

FIG. 5 is a sectional view of a solid-state imaging device along the vertical direction according to still another embodiment of the present invention;

FIG. 6 is a plan view of the arrangement of a CCD solid-state imaging device;

FIG. 7 is a sectional view of a related-art solid-state imaging device along the vertical direction; and FIG. 8 is a sectional view of the related-art solid-state imaging device along the horizontal direction.

DETAILED DESCRIPTION OF THE INVENTION

Embodiments of a solid-state imaging device and a method for manufacturing the same according to the present invention will be specifically described hereinafter.

FIGS. 1 and 2 are sectional views of a solid-state imaging device manufactured by the method according to an embodiment, FIG. 1 showing an embodiment of a channel stop section provided between photosensors along the vertical transfer direction, and FIG. 2 showing an embodiment of a channel stop section provided between the photosensors along the horizontal transfer direction. The entire structure of the solid-state imaging device is the same as that of the related art shown in FIG. 6, wherein FIG. 1 corresponds to the section taken along line A-A of FIG. 6 and FIG. 2 corresponds to the section taken along line B-B of FIG. 6.

Referring first to FIG. 1, a photodiode region constituting a light receiving section 10 of each photosensor includes a P+ type impurity region (hole storage region) 10A formed in the outer layer of a substrate 100 and an N-type impurity region (electron storage region) 10B formed under the P+-type impurity region 10A. The photodiode region photoelectrically converts light that is incident from above, absorbs holes into the P+ type impurity region 10A, and stores electrons in the N-type impurity region 10B, a lower depletion layer and so on.

The photoelectric conversion in the light receiving section 10 is mainly performed in a depletion region between the N-type impurity region 10B and the P+ type impurity region 10A and in a depletion region between the N-type impurity region 10B and a lower P-type impurity region (not shown).

A channel stop section 20 formed of a multilayer P-type impurity region is provided in the vicinity of opposite sides of the photodiode region along the vertical transfer direction.

The channel stop section 20 is formed by multiple times of impurity implanting processes by which four impurity regions 20A, 20B, 20C, and 20D are formed across the depth of the substrate 100 (along the depth of the bulk) to form a P-type region deep in the substrate 100, thereby preventing leakage of electric charges.

Referring to FIG. 2, the photodiode region of each photosensor includes the P+ type impurity region 10A and the N-type impurity region 10B, as that shown in FIG. 1.

A CCD vertical transfer section 40 is formed on the side of the photodiode region through a readout gate.

The CCD vertical transfer section 40 is formed of an upper N-type impurity region 40A and a lower P-type impurity region 40B.

A channel stop section 50 that is a multilayer P-type impurity region is provided between the CCD vertical transfer section 40 and the photodiode region of the adjacent photosensor train.

The channel stop section 50 is formed by multiple times of impurity implanting processes by which four impurity regions 50A, 50B, 50C, and 50D are formed across the depth of the substrate 100 (along the depth of the bulk) to form a P-type region deep in the substrate 100, thereby preventing leakage of electric charges.

In FIGS. 1 and 2, transfer electrodes 60 of the CCD vertical transfer sections 40 and so on are provided on the top of the substrate 100 through a gate insulating film (not shown). However, their detailed description will be omitted here because they are not directly related to the present invention.

When the channel stop sections 20 and 50 are formed in the above-described solid-state imaging device, an ion implantation region is set using a specified mask and multiple times of ion implanting processes are performed with multiple ion implanting energies and impurity concentrations, so that the multilayer impurity regions 20A, 20B, 20C, and 20D and the impurity regions 50A, 50B, 50C, and 50D are formed.

Thus, the channel stop sections 20 and 50 can be formed deep into the substrate 100, thereby preventing the leakage of signal charges between the devices to reduce color mixture.

Since the concentration of impurity in each ion implanting process can be set as appropriate, the concentration of impurity near the surface of the substrate 100 that is formed with low implanting energy can be sufficiently ensured by making the ion concentration of impurity in an ion implanting process with relatively high implanting energy higher than that in an ion implanting process with relatively low implanting energy, so that a smear phenomenon can be prevented.

When the solid-state imaging device is formed, ions are continuously implanted into the substrate 100 to form the photodiode region (light receiving section 10), the CCD vertical transfer section 40, and the respective impurity regions of the channel stop sections 20 and 50; the order thereof is not particularly limited.

Also the order of the multiple times of ion implanting processes for forming the channel stop sections 20 and 50 is not particularly limited.

The mask for ion implantation includes various types in addition to a general resist mask; therefore, it is not particularly limited.

A specific energy and the concentration of impurity in each ion implanting process can be set as appropriate and are not particularly limited.

In the embodiment, the vertical channel stop section 20 and the horizontal channel stop section 50 are separately formed so as to be optimized for the respective required characteristics, with individual ion implanting energy and impurity concentration. In FIGS. 1 and 2, although both the channel stop sections 20 and 50 have four-layer structure (or four-step ion implantation), they are not limited to that and may have a structure other than the four-layer (four-step) structure. The vertical channel stop section 20 and the horizontal channel stop section 50 may not necessarily have the same number of layers.

The impurity concentration may not be varied at all the layers but may be varied at part of the layers.

In the above embodiment, the ion implanting processes for forming the channel stop sections 20 and 50 are carried out with multiple energies and concentrations. However, the ion implantation region is varied in each ion implanting process by changing a mask in each ion implanting process, so that the width across the channel of the respective impurity regions of the channel stop sections 20 and 50 may be varied.

FIG. 3 is a sectional view of an example of the channel stop section along the vertical transfer direction. Since components other than a channel stop section 70 are the same as those of FIG. 1, they are given the same numerals and there description will be omitted.

As shown in the drawing, the channel stop section 70 includes four-layer impurity regions 70A, 70B, 70C, and 70D. When the ion implanting area in an ion implanting process with relatively high implanting energy is made smaller than that in an ion implanting process with relatively low implanting energy, the reduction of the charge storage region of the light receiving section 10 in the deep part of the substrate 100 by the dispersion of P-type impurity of the channel stop section 70 can be prevented; thus, sensitivity of the light receiving section 10 and saturation signals can be increased.

The energy and the impurity concentration can be set as those in FIG. 1.

Although the widths of all the layers of the channel stop section 70 may be varied, only the width of part of the layers may be varied so that only the impurity regions 70A and 70B have the equal width, as shown in FIG. 3. In this case, the layers of an equal width can be formed with a common mask.

The multi-step ion implantation may also be made for the channel stop section along the horizontal transfer direction, with multiple widths.

The above-described embodiments offer the following advantages:

(1) Referring to FIGS. 1 to 3, when multi-step ion implantation of the channel stop section between the vertical photosensors and the channel stop section between the horizontal light receiving section and the vertical transfer section is carried out with multiple energies, a color mixing phenomenon can be prevented in which photoelectrically converted charges are mixed to the adjacent photosensors.

(2) Referring to FIG. 3, when the region of ion implantation with high energy reduced, a color mixing phenomenon can be prevented without narrowing the charge storage region of the light receiving section and decreasing sensitivity and saturation signal.

(3) Referring to FIGS. 1 to 3, when ions are implanted into the channel stop section with high energy, the variation of an overflow barrier at charge storage can be reduced; thus the occurrence of a knee-point (Qknee) in output characteristics can be prevented.

(4) When ion implantation of the channel stop section between the horizontal light receiving section and the vertical transfer section is carried out with multiple energies, a smear phenomenon near the surface and in the bulk can be prevented.

In the above-described embodiments, the positional relationship of the multi-step ion implanted impurity regions is only an example, and the thickness of the impurity regions across the depth of the substrate, the shape, and the number of layers are not limited to that. For example, as shown in FIG. 4, of the multilayer impurity region of a channel stop section 80 (three-layer impurity regions 80A, 80B, and 80C in the drawing), the middle-layer impurity region (the impurity region 80B in the drawing) may be larger in thickness and also in lateral width than the other impurity regions or vice versa.

As a matter of course, the multilayer ion-implanted impurity region may have a part overlapping with the upper and lower impurity regions in the strict sense.

In the above embodiments, although the multilayer ion-implanted impurity region is formed such that the bottom of the lowermost-layer region has a depth substantially equal to that of the bottom of the N-type impurity region 10B in the light receiving section 10, it is not limited to that.

For example, in order to prevent color mixture in a further lower region across the depth of the substrate 100, as shown in FIG. 5, the bottom of the lowermost-layer region (an impurity region 90D in the drawing) of the multilayer ion-implanted impurity region (four-layer impurity regions 90A, 90B, 90C, and 90D in the drawing) of a channel stop section 90 may be formed deeper than the bottom of the N-type impurity region 10B.

As shown in FIG. 5, an overflow barrier 92 located below the light receiving section 10 and the multilayer ion-implanted impurity region (the impurity region 90D in the drawing) may be in contact with each other.

In this case, the holes stored in the overflow barrier 92 can be discharged to the surface of the substrate 100 through the multilayer ion-implanted impurity region. The multilayer ion-implanted impurity region is preferably formed such that the closer to the surface of the substrate 100 the region is, the higher the concentration of the P-type impurity is.

Although a preferred form of the invention has been described in which it is applied to a CCD solid-state imaging device, it is to be understood that the invention is applied not only to the CCD solid-state imaging device but also to a CMOS solid-state imaging device.

As described above, by the method for manufacturing the solid-state imaging device according to the invention, the channel stop section is formed by multiple times of impurity ion implanting processes with multiple implanting energies. Thus, a multilayer impurity region can be formed across the depth of the substrate as a channel stop section.

Therefore, leakage of signal charges between the adjacent photosensors and between the photosensor and the transfer section can be effectively prevented, so that a color mixing phenomenon and so on can be effectively prevented.

During the multiple times of impurity ion-implantation processes, the ion implantation is carried out for multiple implantation areas, so that the dispersion of the impurity can be reduced particularly deep in the substrate, the effects to the photoelectric conversion section can be reduced, and decreases in sensitivity and saturation signals can be effectively prevented.

Furthermore, during the multiple times of impurity ion-implantation processes, the ion implantation is carried out at multiple impurity concentrations, so that the respective impurity regions of the channel stop section can be formed at optimum impurity concentrations; thus anti-smear measures on the surface of the substrate can be effectively taken.

Since the solid-state imaging device according to the invention includes a channel stop section having a multilayer impurity region across the depth of the substrate, leakage of signal charges between the adjacent photosensors and between the photosensor and the transfer section can be effectively prevented; thus, a color mixing phenomenon and so on can be effectively prevented.

Since the multilayer impurity region of the channel stop section has multiple areas, the dispersion of impurity particularly deep in the substrate can be prevented, the effects to the photoelectric conversion section can be reduced, and decreases in sensitivity and saturation signals can be effectively prevented.

Furthermore, the multilayer impurity region of the channel stop section has an optimum impurity concentration at each layer; thus anti-smear measures on the surface of the substrate can be effectively taken.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A solid-state imaging device comprising:
a substrate; a photosensor in the substrate; and
a channel stop section at a side of the photosensor in the substrate,
wherein,
the channel stop section has a plurality of adjoining impurity regions along a direction of increasing depth of the substrate, and
impurity concentrations in the impurity regions increase from bottom to surface of the substrate.

2. The solid-state imaging device according to claim 1, wherein each impurity region of the plurality of adjoining impurity regions, when viewed in the direction of increasing depth of the substrate, has a generally uniform cross-sectional area that is different from the generally uniform cross-sectional area of at least one other impurity region of the plurality of adjoining impurity regions.

3. The solid-state imaging device according to claim 1, wherein, for each successive impurity region of the plurality of adjoining impurity regions in the direction of increasing depth of the substrate, the generally uniform cross-sectional area is less than that of a preceding adjoining impurity region.

4. The solid-state imaging device according to claim 1, wherein each impurity region of the plurality of adjoining impurity regions, when viewed in the direction of increasing depth of the substrate, has a generally uniform cross-sectional area equal to the generally uniform cross-sectional area of each other impurity region of the plurality of adjoining impurity regions.

5. The solid-state imaging device according to claim 1, wherein each impurity region of the plurality of adjoining impurity regions has an ion concentration different from the ion concentration of at least one other impurity region of the plurality of adjoining impurity regions.

6. The solid-state imaging device according to claim 1, wherein each impurity region of the plurality of adjoining impurity regions has an ion concentration equal to the ion concentration of each other impurity region of the plurality of adjoining impurity regions.

7. The solid-state imaging device according to claim 1, wherein the solid-state imaging device is a CCD solid-state imaging device.

8. The solid-state imaging device according to claim 1, wherein the solid-state imaging device is a CMOS solid-state imaging device.

9. A solid-state imaging device comprising:
a substrate;
a photosensor in the substrate;
a channel stop section at a side of the photosensor in the substrate; and
an overflow barrier in the substrate,
wherein,
the channel stop section is in contact with the overflow barrier and has a plurality of adjoining impurity regions along a direction of increasing depth of the substrate, and
impurity concentrations in the impurity regions increase from bottom to surface of the substrate.

10. The solid-state imaging device according to claim 9, wherein each impurity region of the plurality of adjoining impurity regions, when viewed in the direction of increasing depth of the substrate, has a generally uniform cross-sectional area that is different from the generally uniform cross-sectional area of at least one other impurity region of the plurality of adjoining impurity regions.

11. The solid-state imaging device according to claim 9, wherein each impurity region of the plurality of adjoining impurity regions, when viewed in the direction of increasing depth of the substrate, has a generally uniform cross-sectional area equal to the generally uniform cross-sectional area of each other impurity region of the plurality of adjoining impurity regions.

12. The solid-state imaging device according to claim 9, wherein each impurity region of the plurality of adjoining impurity regions has an ion concentration different from the ion concentration of at least one other impurity region of the plurality of adjoining impurity regions.

13. The solid-state imaging device according to claim 9, wherein each adjoining impurity region of the plurality of impurity regions has an ion concentration equal to the ion concentration of each other impurity region of the plurality of adjoining impurity regions.

14. The solid-state imaging device according to claim 9, wherein the solid-state imaging device is a CCD solid-state imaging device.

15. The solid-state imaging device according to claim 9, wherein the solid-state imaging device is a CMOS solid-state imaging device.

16. The solid-state imaging device according to claim 9, wherein, for each successive impurity region of the plurality of adjoining impurity regions in the direction of increasing depth of the substrate, the generally uniform cross-sectional area is less than that of a preceding adjoining impurity region.

* * * * *